US010550276B2

(12) United States Patent
Allemand

(10) Patent No.: US 10,550,276 B2
(45) Date of Patent: Feb. 4, 2020

(54) PHOTOSENSITIVE INK COMPOSITIONS AND TRANSPARENT CONDUCTORS AND METHOD OF USING THE SAME

(71) Applicant: Cambrios Film Solutions Corporation, Tortola (VG)

(72) Inventor: Pierre-Marc Allemand, San Jose, CA (US)

(73) Assignee: Cambrios Film Solutions Corporation, Tortola (VG)

( * ) Notice: Subject to any disclaimer, the term of this patent is extended or adjusted under 35 U.S.C. 154(b) by 0 days.

(21) Appl. No.: 15/372,641

(22) Filed: Dec. 8, 2016

(65) Prior Publication Data

US 2017/0088726 A1 Mar. 30, 2017

Related U.S. Application Data

(62) Division of application No. 13/021,274, filed on Feb. 4, 2011, now Pat. No. 9,534,124.

(60) Provisional application No. 61/302,013, filed on Feb. 5, 2010.

(51) Int. Cl.
| | |
|---|---|
| *H01B 1/22* | (2006.01) |
| *C09D 11/101* | (2014.01) |
| *C09D 5/24* | (2006.01) |
| *C09D 11/52* | (2014.01) |
| *B05D 3/06* | (2006.01) |
| *C09D 11/106* | (2014.01) |
| *C09D 11/14* | (2006.01) |
| *C09D 139/06* | (2006.01) |
| *G03F 7/20* | (2006.01) |
| *G03F 7/32* | (2006.01) |

(52) U.S. Cl.
CPC ............ *C09D 11/101* (2013.01); *B05D 3/067* (2013.01); *C09D 5/24* (2013.01); *C09D 11/106* (2013.01); *C09D 11/14* (2013.01); *C09D 11/52* (2013.01); *C09D 139/06* (2013.01); *G03F 7/2002* (2013.01); *G03F 7/2022* (2013.01); *G03F 7/32* (2013.01); *H01B 1/22* (2013.01)

(58) Field of Classification Search
USPC .......................................................... 427/58
See application file for complete search history.

(56) References Cited

U.S. PATENT DOCUMENTS

| | | | | |
|---|---|---|---|---|
| 8,252,386 B2 * | 8/2012 | Seon | ........................ | C08J 7/047 427/487 |
| 2004/0025934 A1 * | 2/2004 | Chittibabu | ........... | H01G 9/2031 136/263 |
| 2008/0292979 A1 * | 11/2008 | Ding | ....................... | B82Y 10/00 430/56 |
| 2009/0108752 A1 * | 4/2009 | Matsuno | .................. | H01B 1/16 313/582 |
| 2009/0166055 A1 * | 7/2009 | Guiheen | .................. | H01B 1/22 174/126.1 |

(Continued)

FOREIGN PATENT DOCUMENTS

| | | | | |
|---|---|---|---|---|
| EP | 1930933 A2 * | 6/2008 | ............. | H01J 1/304 |
| JP | 2008243600 A | 10/2008 | | |

(Continued)

*Primary Examiner* — Brian K Talbot
(74) *Attorney, Agent, or Firm* — Cooper Legal Group, LLC

(57) ABSTRACT

This disclosure is related to photosensitive ink compositions comprising conductive nanostructures and a photosensitive compound, and method of using the same.

23 Claims, 3 Drawing Sheets

(56) References Cited

U.S. PATENT DOCUMENTS

2009/0301767 A1* 12/2009 Mok ................. B82Y 10/00
174/255

FOREIGN PATENT DOCUMENTS

WO    WO 2007/044184    *  4/2007
WO    WO-2010143701 A1 * 12/2010 ............ B82Y 30/00

* cited by examiner

PHOTOSENSITIVE INK COMPOSITIONS AND TRANSPARENT CONDUCTORS AND METHOD OF USING THE SAME

CROSS-REFERENCE TO RELATED APPLICATION

This application claims priority to U.S. patent application Ser. No. 13/021,274, titled "PHOTOSENSITIVE INK COMPOSITIONS AND TRANSPARENT CONDUCTORS AND METHOD OF USING THE SAME" and filed on Feb. 4, 2011, which claims priority to U.S. Provisional Patent Application No. 61/302,013, titled "PHOTOSENSITIVE INK COMPOSITIONS AND METHOD OF USING THE SAME" and filed on Feb. 5, 2010. Application Ser. Nos. 13/021,274 and 61/302,013 are incorporated herein by reference in its entirety.

BACKGROUND

Technical Field

This disclosure is related to photosensitive ink compositions comprising conductive nanostructures, as well as methods of using or patterning the same.

Description of the Related Art

Transparent conductors are optically clear and electrically conductive films. They are in widespread use in areas of display, touch-panel, photovoltaic (PV), various types of e-paper, electrostatic shielding, heating or anti-reflective coatings (e.g., windows), etc. Various technologies have produced transparent conductors based on one or more conductive media such as metallic nanostructures, transparent conductive oxides (e.g., via sol-gel approach), conductive polymers, and/or carbon nanotubes.

To prepare a nanostructure-based conductive film, an ink composition, which is a suspension of conductive nanostructures in a suspending fluid, is deposited on a transparent substrate. In general, a transparent conductor further includes the transparent substrate on which the conductive film is deposited or coated.

Depending on the end use, the transparent conductors can be created with predetermined electrical and optical properties, as well as pre-determined patterns. There is a need for direct patterning nanostructure-based conductive films.

BRIEF SUMMARY

Described herein are photosensitive ink compositions suitable for forming nanostructure-based conductive films, as well as methods of direct photo-patterning of the same.

One embodiment provides an ink composition comprising: a plurality of conductive nanostructures; a binding material; a photosensitive compound; and a polar solvent. In more specific embodiments, the crosslinkable polymer is polyvinylpyrrolidone or hydroxypropylmethyl cellulose.

A further embodiment provides a method comprising: depositing an ink composition on a substrate, wherein the ink composition comprises a plurality of conductive nanostructures, a crosslinkable polymer, a photoinitiator, and a polar solvent; forming a thin film of interconnecting nanowires by removing the polar solvent; and exposing a portion of the thin film to a UV light source to cause the crosslinkable polymer in the exposed portion of the thin film to crosslink.

Another embodiment provides a conductive film comprising: a plurality of interconnecting conductive nanostructures; a binding material, wherein the interconnecting conductive nanostructures are embedded in the binding material; and a photosensitive compound.

Yet another embodiment provides a method comprising: forming a thin film of interconnecting conductive nanostructures on a substrate by depositing an ink composition on the substrate, wherein the ink composition comprises a plurality of conductive nanostructures, a binder material, a heat-activatable photosensitive compound, and a polar solvent; and removing the polar solvent; placing a mask above the thin film, wherein the mask includes an opening and defines the thin film into a masked region and an unmasked region, the unmasked region corresponding to the opening; exposing the thin film to a UV light source through the opening of the mask at a first temperature to cause photo-degradation of the photosensitive compound in the unmasked region; and exposing the thin film to a heat source in the dark at a second temperature to cause thermal-degradation of the photosensitive compound in the masked region.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been selected solely for ease of recognition in the drawings.

DETAILED DESCRIPTION

Figure 1A:
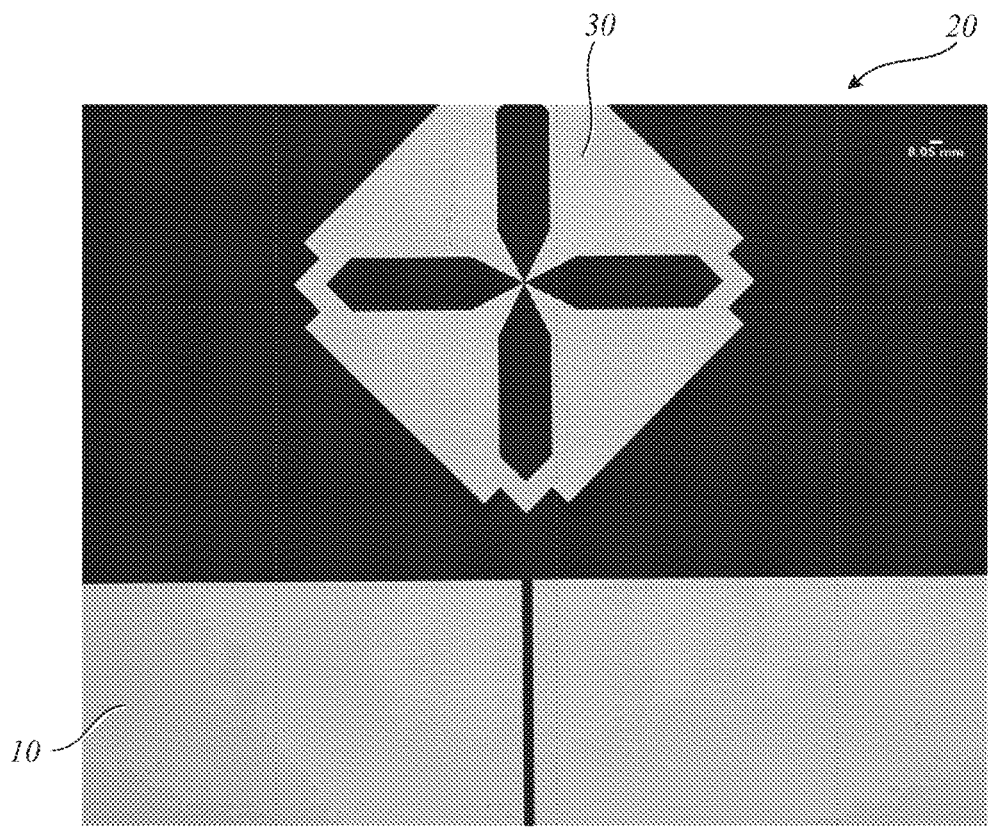
FIG. 1A shows a mask placed above a conductive film prepared according to one embodiment.

In various embodiments, the transparent conductors described herein are thin films cast from liquid suspensions of conductive nanostructures, which are also referred to as "ink compositions" or "ink." In addition to the conductive nanostructures, the ink composition comprises a binder material (e.g., a crosslinkable polymer), a photosensitive compound (e.g., photoinitiator), and a polar solvent. As described herein in further detail, the ink composition and the transparent conductor (conductive film) formed from the same are photosensitive owing to the presence of the photosensitive compound, which absorbs photons and undergoes a chemical or physical transformation. Depending on the types of the photosensitive compound in the ink and the resulting transparent conductor, various approaches can be taken to develop photo images in the transparent conductor.

Nanostructures

As used herein, "conductive nanostructures" or "nanostructures" generally refer to electrically conductive nano-sized structures, at least one dimension of which (i.e., width or diameter) is less than 500 nm, more typically, less than 100 nm or 50 nm. In various embodiments, the width or diameter of the nanostructures are in the range of 10 to 40 nm, 20 to 40 nm, 5 to 20 nm, 10 to 30 nm, 40 to 60 nm, 50 to 70 nm.

Lengthwise, the nanostructures are more than 500 nm, or more than 1 µm, or more than 10 µm in length. In various embodiments, the lengths of the nanostructures are in the range of 5 to 30 µm, or in the range of 15 to 50 µm, 25 to 75 µm, 30 to 60 µm, 40 to 80 µm, or 50 to 100 µm.

The nanostructures can be of any shape or geometry. One way for defining the geometry of a given nanostructure is by its "aspect ratio," which refers to the ratio of the length and the width (or diameter) of the nanostructure. In certain embodiments, the nanostructures are isotropically shaped (i.e., aspect ratio=1). Typical isotropic or substantially isotropic nanostructures include nanoparticles. In preferred embodiments, the nanostructures are anisotropically shaped (i.e., aspect ratio≠1). The anisotropic nanostructure typically has a longitudinal axis along its length. Exemplary anisotropic nanostructures include nanowires (solid nanostructures having an aspect ratio of at least 10, and more typically, at least 50), nanorod (solid nanostructures having an aspect ratio of less than 10) and nanotubes (hollow nanostructures).

The nanostructures can be of any conductive material. More typically, the nanostructures are formed of a metallic material, including elemental metal (e.g., transition metals) or a metal compound (e.g., metal oxide). The metallic material can also be a bimetallic material or a metal alloy, which comprises two or more types of metal. Suitable metals include, but are not limited to, silver, gold, copper, nickel, gold-plated silver, platinum and palladium.

In various embodiments, the nanostructures are silver nanowires.

In other embodiments, the nanostructures are gold nanotubes.

In further embodiments, the nanostructures are gold-plated silver nanowires.

The nanostructures suitable for forming the ink compositions described herein can be prepared according to the methods described in, for example, co-pending and co-owned applications, U.S. application Ser. Nos. 11/766,552, 11/504,822, and 12/106,2446, all the in the name of Cambrios Technologies Corporation, which applications are incorporated herein by reference in their entireties.

In further embodiments, the nanostructures in an ink composition have a pre-determined size distribution, in which a certain percentage of the entire population of the nanostructures (e.g., more than 90%) is within a size (length and/or width) limit. More detailed description directed to controlling size distribution in a given population of nanostructures can be found in a co-pending and co-owned application, U.S. patent application Ser. No. 13/007,305, in the name of Cambrios Technologies Corporation, which application is incorporated herein by reference in its entirety.

In various embodiments, the nanostructures are present in the ink composition at about 0.1-0.5% (w/w), 0.5-1% (w/w), 1-5% (w/w) or 5-10% (w/w). Preferably, the nanostructures are present in the ink composition at about 0.1 (w/w), 1% (w/w), or 10% (w/w).

Binding Material

In addition to the nanostructures, the ink composition further comprises a binding material, which is typically soluble or miscible in a polar solvent, a major component of the ink composition. In a conductive film formed from the ink composition, the binding material serves to bind the nanostructures together as well as promote adhesion of the nanostructures to a substrate. In various embodiments, the physical characteristics of a given binding material may influence the viscosity, cohesiveness and adhesiveness of the conductive film. Under certain circumstances (e.g., patterning), the binding material (also referred to as "binder") in the conductive film may further undergo physical or chemical transformations such as curing or crosslinking.

In certain embodiments, the binding material is a crosslinkable polymer. As used herein, a "crosslinkable polymer" or "polymer" refers to a substantially linear polymer that, in the presence of a photosensitive compound (e.g., a photoinitiator) and in response to photo-irradiation in the ultra violet (UV) range (10-400 nm) or visible range (400-750 nm), forms chemical bonds between two or more polymer chains.

In accordance with various embodiments, the crosslinkable polymer is soluble or miscible in the ink composition and functions as, in part, a viscosity modifier, which regulates the viscosity of the ink and the dispersibility of the nanostructures therein.

The linear polymer chains of the polymer can crosslink under photo-irradiation. In certain embodiments, photo-irradiation causes the photosensitive compound (e.g., photoinitiator) to release highly reactive species (e.g., radicals, cations or anions). The reactive species generated from the initial photo-irradiation trigger formations of reactive species in the polymer chains, which result in the formations of chemical bonds that bridge or crosslink two or more polymer chains. Polymer chains that contain chemical moieties such as hydroxyl groups, carbonyl groups, carboxy groups, and olefin groups are photosensitive as these groups are either susceptible to or can cause their neighboring atoms (e.g., carbon) to be susceptible to free radical reactions.

Depending on the specific chemical structures of the crosslinkable polymer, the crosslinking process causes the formations of at least one type of chemical bonds, namely, covalent, ionic or hydrogen bond. The specific chemical structures of the crosslinkable polymer further affect the degree of crosslinking, i.e., the number of bonds formed that bridge the polymer chains.

The crosslinking process typically promotes a modification in the properties of the crosslinkable polymer. Thus, following irradiation, the crosslinkable polymer is converted to a crosslinked polymer, the properties of which differ from those of the crosslinkable polymer. Notably, the crosslinked polymer loses all or part of the flexibility of the original linear polymer chain. In addition, the crosslinked polymer is substantially less soluble in a given solvent, as compared to a linear crosslinkable polymer. Other properties of the crosslinkable polymer that may differ from those of the linear polymer include, for example, increased viscosity and adhesiveness.

In certain embodiments, suitable crosslinkable polymers can be hydroxyl-containing or carboxy-containing cellulosic polymers, such as hydroxypropylmethyl cellulose (HPMC), hydroxypropylmethyl cellulose phthalate, hydroxypropyl cellulose (HPC), hydroxybutylmethyl cellulose, ethylhydroxyethyl cellulose, sodium carboxymethyl-hydroxyethyl cellulose, and carboxymethylethyl cellulose.

In other embodiments, suitable crosslinkable polymers can be a hydrophilic polymer, including, without limitation, polyvinyl alcohol (PVA), polyvinylpyrrolidone (PVP), polyacrylamides, polyacrylates, polyethylene oxides, polyethylene imine, anionic and cationic polyelectrolytes (i.e., charged water-soluble polymers such as sodium salt of polyacrylic acid), and poly (2-ethyl-2-oxazoline).

In a preferred embodiment, the crosslinkable polymer is PVP. Typically, the molecular weight of PVP is in the range of 50,000 to 2,000,000 Daltons. PVP suitable for the ink compositions described herein include, for example, LUVITEC® K, which is commercially available from BASF (Germany).

In a further preferred embodiment, the crosslinkable polymer is HPMC. Typically, the molecular weight of HPMC is in the range of 120,000 Daltons. HPMC suitable for the ink compositions described herein include, for example, METHOCEL 311®, which is commercially available from Dow Chemicals, and may be optionally purified according to the methods described in co-pending and co-owned U.S. patent application Ser. No. 12/773,734, which application is incorporated herein by reference in its entirety.

It should be understood that a crosslinkable polymer may be capable of crosslinking under one condition, but incapable of crosslinking under another condition.

In various embodiments, the crosslinkable polymer is present in the ink composition at about 0.1-0.5% (w/w), 0.5-1% (w/w), 1-5% (w/w) or 5-10% (w/w). Preferably, the crosslinkable polymer is present in the ink composition at about 0.1 (w/w), 1% (w/w), or 10% (w/w).

Photosensitive Compound

As used herein, "photosensitive compound" refers to a chemical compound that, upon absorption of light (in the UV range or visible range), undergoes a rapid photoreaction to produce highly reactive species, such as free radicals and charged species (cations or anions). Typically, the photosensitive compound contains one or more photo-labile bonds, which are highly reactive or unstable when exposed to the UV-VIS light. In addition, the photosensitive compound suitable for the ink compositions described herein are soluble or miscible in the ink composition, i.e., they are soluble in a polar solvent, as described herein.

In certain embodiments, the photosensitive compound is also referred to as a "photoinitiator" because it generates reactive species that are capable of triggering further formations of reactive species in the binder material (e.g., crosslinkable polymer), causing the formation of chemical bonds among the polymer chains. Thus, photosensitive transparent conductor can be patterned in a manner similar to photoresist patterning. For example, the binder material (e.g., crosslinkable polymer) in regions of the transparent conductor that are exposed to the photo-irradiation forms a crosslinked polymer; whereas the binder material in the non-exposed region can be removed along with the nanowires embedded therein. Thus, a latent image in the transparent conductor following photo-irradiation may be developed in a solution phase to obtain conductive regions in which nanostructures are embedded in a crosslinked polymer and non-conductive regions that are devoid of nanostructures.

Suitable photoinitiators include, for example, the water soluble benzoylphenyl carboxylate compounds described in WO 2007/044184, which reference is incorporated herein by reference in its entirety Other suitable photoinitiators include azo-type water-soluble photoinitiators, including those that are commercially available from Wako Pure Chemical Industry, Ltd, Japan). One example is 4,4'-Diazido-2,2'-stilbenedisulfonic acid disodium salt.

A preferred photoinitiator is IRGACURE® 754, i.e., oxy-phenyl-acetic acid 2-[2-oxo-2-phenyl-acetoxy-ethoxy]-ethyl ester (Ciba Specialty Chemicals, NY, USA, part of BASF).

In various embodiments, the photoinitiator is present in the ink composition at about 0.005-0.01% (w/w), 0.01-0.05% (w/w), 0.05-0.1% (w/w), 0.1-0.5% (w/w), 0.5-1% (w/w). Preferably, the photoinitiator is present in the ink composition at about 0.01% (w/w), 0.1% (w/w), or 1% (w/w).

In other embodiments, the photosensitive compound undergoes photo-degradation without an apparent effect on the binder material or the nanostructures at a first temperature. However, such a photosensitive compound may be thermally degraded at a second, higher temperature, producing degradation products that are caustic and damaging to the nanostructures.

As discussed in further detail herein, transparent conductor comprising a heat-activatable photosensitive compound can be patterned by sequential exposures to photo-irradiation and heat. As a result, the photosensitive compound in regions that are exposed to the photo-irradiation (e.g., through openings of a mask) degrades or self-destructs without affecting the binder material or the nanowires. In the subsequent thermal treatment in the dark, the photosensitive compound in the previously masked regions is activated by heat, whereby thermal degradation products effectively etch or otherwise cause damage to the nanowires, leading to a higher resistance in the masked region. The resistance in the unmasked region, on the other hand, remains unaffected because the initial photo-irradiation has destroyed any heat-activatable photosensitive compound therein.

In various embodiments, heat-activatable photosensitive compounds include cationic photosensitive compounds or anionic photosensitive compounds. In particular, cationic photosensitive compounds include photo acid generators, which are commonly used in connection with chemically amplified photoresists. Moon S. Y. et al., *Journal of Polymer Science: Part C: Photochemistry Reviews*, (8): 157-173, (2007). These photosensitive compounds are typically soluble in a polar solvent and degrade into acids (cations) upon photo-irradiation. The acid produced is generally not sufficiently concentrated to damage the metal nanostructures or cause the binder material to crosslink. On the other hand, when heated in the absence of the light irradiation, photo acid generators of the present disclosure degrade into caustic degradation products that are capable of damaging the metal nanostructures, thereby reducing the conductivity of individual nanostructures as well as the interconnectivity between nanostructures.

Exemplary cationic photosensitive compounds include, without limitation, onium salts such as diaryl iodonium salts, triaryl sulfonium salts and diazonium salts. Crivello J. V., *Journal of Polymer Science: Part A: Polymer Chemistry*, (37): 4241-4254, (1999), which reference is incorporated by reference in its entirety.

A diaryl iodonium salt comprises a diaryl iodonium cation and a counter ion. Typically, the diaryl moiety is diphenyl, dinaphthyl or phenylnaphthyl, in which the phenyl or the naphthyl moieties may be optionally substituted with alkyl, aryl, halogen, alkoxy, carboxy and the like. The counter ion may be chloride, nitrate, tetrafluoroborate, hexafluorophosphate, hexafluoroarsenate, or hexafluoroantimonate. A preferred photo acid generator is diphenyliodonium nitrate (DPIN). Additional exemplary diaryliodonium salts include, for example, bis(4-tert-butylphenyl)iodonium p-toluenesulfonate, bis(4-tert-butylphenyl)iodonium p-toluenesulfonate, bis(4-tert-butylphenyl)iodonium triflate, bis(4-tert-butylphenyl)iodonium perfluoro-1-butanesulfonate, bis(4-tert-butylphenyl)iodonium triflate, diphenyliodonium p-toluenesulfonate and diphenyliodonium perfluoro-1-butanesulfonate.

A triaryl sulfonium salt comprises a triaryl sulfonium cation and a counter ion. Typically, the triaryl moiety is triphenyl, trinaphthyl, diphenylnaphthyl, or phenyl-dinaphthyl, in which the phenyl or the naphthyl moieties may be optionally substituted with alkyl, aryl, halogen, alkoxy, carboxy and the like. The counter ion may be chloride, nitrate, tetrafluoroborate, hexafluorophosphate, hexafluoroarsenate, or hexafluoroantimonate. Exemplary triaryl sulfonium salts include, for example, (4-bromophenyl)diphenylsulfonium triflate, (4-chlorophenyl)diphenylsulfonium triflate, (4-fluorophenyl)diphenylsulfonium triflate, (4-iodophenyl)diphenylsulfonium triflate, (4-methoxyphenyl)diphenylsulfonium triflate, (4-methylphenyl)diphenylsulfonium triflate, (4-methylthiophenyl)methyl phenyl sulfonium triflate, (4-phenoxyphenyl)diphenylsulfonium triflate, (4-phenylthiophenyl)diphenylsulfonium triflate, (4-tert-butylphenyl)diphenylsulfonium triflate, (tert-butoxycarbonylmethoxynaphthyl)-diphenylsulfonium triflate, 1-naphthyl diphenylsulfonium triflate, boc-methoxyphenyldiphenylsulfonium triflate, triarylsulfonium hexafluoroantimonate, triarylsulfonium hexafluorophosphate, triphenylsulfonium perfluoro-1-butanesulfonate, triphenylsulfonium triflate, tris(4-tert-butylphenyl)sulfonium perfluoro-1-butanesulfonate, and tris(4-tert-butylphenyl)sulfonium triflate.

In addition to the diaryl iodonium salts and triaryl sulfonium salts described above, other exemplary cationic photosensitive compounds include 2-(4-methoxystyryl)-4,6-bis(trichloromethyl)-1,3,5-triazine, N-hydroxynaphthalimide triflate, and N-hydroxy-5-norbornene-2,3-dicarboximide perfluoro-1-butanesulfonate. All of the cationic photosensitive compounds described herein are commercially available from Sigma-Aldrich® (St. Louis, Mo.).

Polar Solvent

The bulk of the ink composition is composed of a polar solvent, which solubilizes the constituents of the ink as well as prevents the nanostructures from aggregating. As used herein, "polar solvent" refers to a fluid that has a Snyder polarity index of at least 4. A Snyder polarity index is a relative measure of the degree of interaction of the solvent with various polar test solutes (see Snyder L. R. "Classification of the Solvent Properties of Common Liquids," *Journal of Chromatography Science,* 16: 223, (1978), incorporated herein by reference).

In various embodiments, the polar solvent is a protic solvent, which is a chemical compound comprising a hydrogen atom bound to an electro-negative atom such as an oxygen and a nitrogen. Thus, a protic solvent typically includes a hydroxyl group and/or an amino group.

In preferred embodiments, the polar solvent contains at least one hydroxyl group. In this regard, "monohydric polar solvent" refers to a polar solvent (as defined herein) that contains a single hydroxyl group, whereas "polyhydric polar solvent" refers to a polar solvent (as defined herein) that contains at least two hydroxyl groups (e.g., glycols).

In various embodiments, the polar solvent has a boiling point of no more than 250° C., typically, no more than 200° C., more typically, no more than 150° C.

Suitable polar solvents include, for example, water, monohydric and polyhydric alcohols like methanol, ethanol, n-propanol, propane-2-diol and glycerol, ethylene glycol, propylene glycol, propane-1,3-diol, butane-1,4-diol, 2-butene-1,4-diol, and the like, or mixtures of two or more such glycols.

In certain embodiments, suitable polar solvents can be polyhydric alcohols that are further modified with one or more ether moieties, so long as at least one hydroxyl group still remains. These polar solvents include propylene glycol monomethyl ether (PGME), ethylene glycol monomethyl ether (EGME), propane-1,3-diol monomethyl ether, and the like.

Optional Components

In addition to the above components, the ink composition may further comprise optional components including a surfactant, and one or more co-solvents.

Typical surfactants such as ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont). In one embodiment, the surfactant is present at about 0.01% of the total weight of the ink composition.

Representative examples of suitable surfactants include fluorosurfactants such as ZONYL® surfactants, including ZONYL® FSN, ZONYL® FSO, ZONYL® FSA, ZONYL® FSH (DuPont Chemicals, Wilmington, Del.), and NOVEC™ (3M, St. Paul, Minn.). Other exemplary surfactants include non-ionic surfactants based on alkylphenol ethoxylates. Preferred surfactants include, for example, octylphenol ethoxylates such as TRITON™ (X-100, X-114, X-45), and nonylphenol ethoxylates such as TERGITOL™ (Dow Chemical Company, Midland Mich.). Further exemplary non-ionic surfactants include acetylenic-based surfactants such as DYNOL® (604, 607) (Air Products and Chemicals, Inc., Allentown, Pa.) and n-dodecyl β-D-maltoside.

A co-solvent can be a second polar solvent, as described herein. For example, in various embodiments, the ink composition comprises both water and PGME, or PGME and methanol.

Ink Compositions

The ink composition combines the components described herein in pre-determined ratios, which can vary depending on the substrate and the method of depositions used.

In various embodiments, the ratio of the crosslinkable polymer to the nanostructures (e.g., metal nanowires) is preferably in the range of about 5 to about 0.000625, more typically, about 1; and the ratio of the photoinitiator to the crosslinkable polymer is about 0.01 to 0.1.

The ink composition typically has a viscosity in the range of 1-1000 cP. A preferred viscosity range is between about 1 and 100 cP (e.g., for spin coating).

In other various embodiments, the ink composition comprises the following components (in percentage weight of the total weight of the ink composition):

metal nanowires: 0.1% to 1% or 1% to 10%;
binder material: 0.1% to 1%, or 1% to 10%;
photosensitive compound: 0.01% to 0.1%, or 0.1% to 1%; and
surfactant: 0%-0.001% or 0.01% to 0.1%.

A typical ink composition for depositing metal nanowires comprises, by weight, from 0.0025% to 0.1% surfactant (e.g., a preferred range is from 0.0025% to 0.05% for ZONYL® FSO-100 or 0.005% to 0.025% for TRITON™ X-100), from 0.02% to 4% crosslinkable polymer (e.g., a preferred range is 0.02% to 0.5% for HPMC), from 0.01 to 1.5% metal nanowires, from 0.005 to 0.5% of photoinitiator and from 94.5% to 99.0% polar solvent.

Certain embodiments provide that in each of the above embodiments, the nanostructures are metal nanowires (e.g., silver nanowires).

One embodiment provides an ink composition that comprises a plurality of nanostructures, a crosslinkable polymer comprising HPMC, a photoinitiator, water and optionally PGME. More specifically, the nanostructures are silver nanowires.

In one embodiment, the ink composition comprises 12 mg IRGACURE® 754, 5 g of PGME, and 5 g of a formulation that comprises 0.38%-0.4% silver nanowires, 0.4% HPMC, 0.0025% TRITON™ X-100, and water.

A further embodiment provides an ink composition that comprises a plurality of nanostructures, a crosslinkable polymer comprising PVP, a photoinitiator, water and optionally PGME. More specifically, the nanostructures are silver nanowires.

In one embodiment, the ink composition comprises, by weight percentage, 0.1% IRGACURE® 754, 1% PVP (MW=1,300,000), 0.5% silver nanowires, 85% PGME and 14% water.

In another embodiment, the ink composition comprises, by weight percentage, 0.4% diphenyliodonium nitrate, 0.4% HPMC, 0.2% silver nanowires, 100 ppm of TRITON™ X-100, and water.

Thin Film Formation

The ink composition can be deposited on the substrate according to, for example, the methods described in co-pending U.S. patent application Ser. No. 11/504,822.

Thus, described herein is a method that comprises: depositing an ink composition on a substrate, wherein the ink composition comprises a plurality of nanostructures, a crosslinkable polymer, a photoinitiator, and a polar solvent; and allowing the solvent to dry.

Spin coating is a typical technique for depositing a uniform film on a substrate. By controlling the loading amount, spin speed and time, thin films of various thicknesses can be formed. It is understood that the viscosity and the shear behavior of the suspending fluid, as well as the interactions between the nanowires, may affect the distribution and interconnectivity of the nanowires deposited.

For example, the ink compositions described herein can be spin-coated on a glass substrate at a speed of 400-2000 rpm for 60 seconds, with acceleration 1000 rpm/s. The thin film can be further subjected to certain post-treatments, including baking at 50° C. for 90 seconds and 140° C. for 90 seconds. Pressure treatment with or without heat can be further employed to adjust the final film specifications.

As understood by one skilled in the art, other deposition techniques can be employed, e.g., sedimentation flow metered by a narrow channel, die flow, flow on an incline, slit coating, gravure coating, microgravure coating, bead coating, dip coating, slot die coating, and the like. Printing techniques can also be used to directly print an ink composition onto a substrate with or without a pattern. For example, inkjet, flexoprinting and screen printing can be employed.

The substrate can be any material onto which nanowires are deposited. The substrate can be rigid or flexible. Preferably, the substrate is also optically clear, i.e., light transmission of the material is at least 80% in the visible region (400 nm-700 nm).

Examples of rigid substrates include glass, polycarbonates, acrylics, and the like. In particular, specialty glass such as alkali-free glass (e.g., borosilicate), low alkali glass, and zero-expansion glass-ceramic can be used. The specialty glass is particularly suited for thin panel display systems, including liquid crystal display (LCD).

Examples of flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films.

Drying can be carried out by air drying, drying under nitrogen purging, or baking in an oven. The polar solvents described herein have relatively low boiling points (e.g., no more than 250° C.) such that they can be removed with ease. Typically, drying (e.g., baking) at 140° C. or below is sufficient to promote solvent removal and film formation.

The thin films thus formed are electrically conductive, in which one or more electrically conductive paths are established through continuous physical contacts among the nanostructures.

The electrical conductivity of the conductive film is often measured by "film resistance," "resistivity" or "sheet resistance," which is represented by ohm/sq (or "Ω/□"). The film resistance is a function of at least the surface loading density, the size/shapes of the nanostructures, and the intrinsic electrical property of the nanostructure constituents. As used herein, a thin film is considered conductive if it has a sheet resistance of no higher than $10^8 \Omega/\square$. Preferably, the sheet resistance is no higher than $10^4 \Omega/\square$, 3,000Ω/□, 1,000Ω/□ or 350Ω/□, or 100Ω/□. Typically, the sheet resistance of a conductive network formed by metal nanostructures is in the ranges of from 10Ω/□ to 1000Ω/□, from 100Ω/□ to 750Ω/□, from 50Ω/□ to 200Ω/□, from 100Ω/□ to 500Ω/□, or from 100Ω/□ to 250Ω/□, or from 10Ω/□ to 200Ω/□, from 10Ω/□ to 50Ω/□, or from 1Ω/□ to 10Ω/□.

Optically, the nanostructure-based transparent conductors have high light transmission in the visible region (400-700 nm). Typically, the transparent conductor is considered optically clear when the light transmission is more than 85% in the visible region. More typically, the light transmission is more than 90%, or more than 93%, or more than 95%.

Haze is another index of optical clarity. It is generally recognized that haze results from light scattering and reflection/refraction due to both bulk and surface roughness effects. In various embodiments, the haze of the transparent conductor is no more than 10%, no more than 8%, no more than 5% or no more than 1%.

Thus, one embodiment provides a conductive thin film comprising a plurality of interconnecting nanostructures, a binder material (e.g., a crosslinkable polymer), and a photosensitive compound. In further embodiments, the conductive thin film has a light transmission of more than 85% and a sheet resistance of no more than 1000Ω/□. Various other embodiments are directed to conductive thin films having a sheet resistance of no more than 750Ω/□, no more than 500Ω/□, no more than 400Ω/□, no more than 200Ω/□, or no more than 100Ω/□.

Photo-Patterning

1. Solvent Development

Figure 1B:
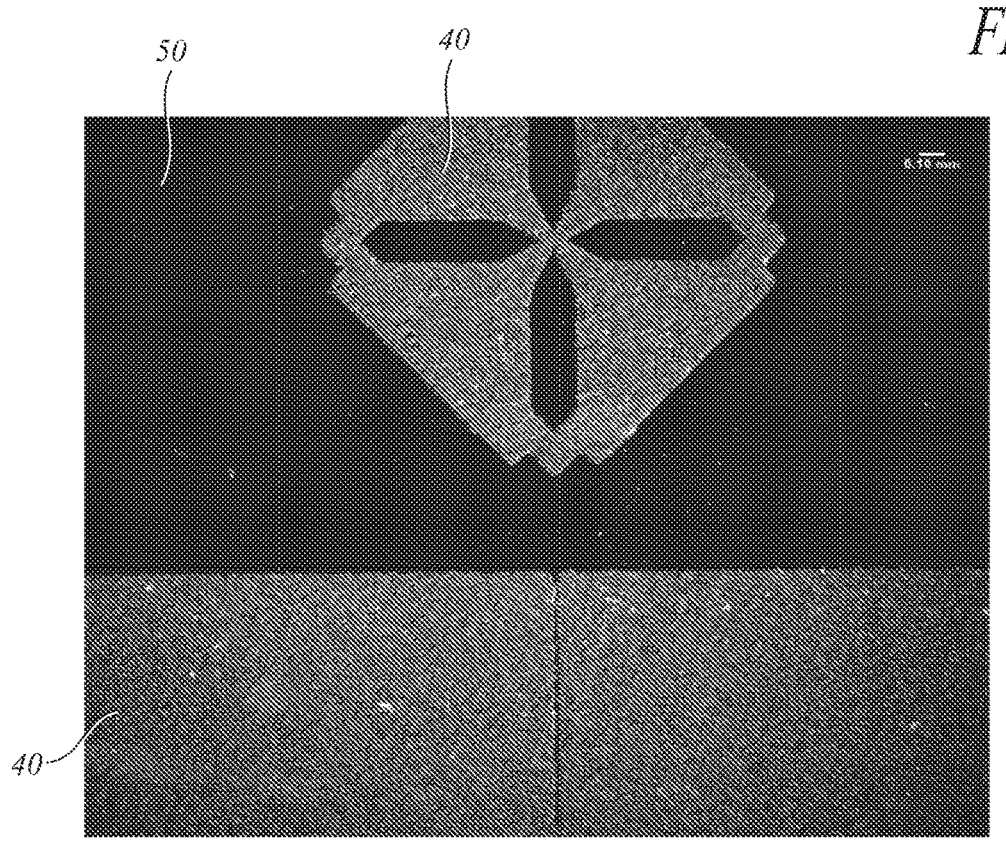
FIG. 1B shows a patterned conductive film following direct photo-patterning.

In certain embodiments, the photosensitive thin films described herein can be directly photo-patterned. Typically, the thin film comprises a photoinitiator that is capable of causing the binder material (e.g., crosslinkable polymer) to crosslink upon photo-irradiation. More specifically, as shown in FIG. 1A, following the formation of a thin film 10, a mask 20 is used to define a pattern on the thin film according to one or more openings or apertures 30 in the mask. The thin film 10 is thus defined into a masked region and an unmasked region, whereby the unmasked region corresponds to the one or more openings 30 in the mask. Thereafter, as shown in FIG. 1B, the thin film is exposed to a UV light source to allow only the crosslinkable polymer in the unmasked region 40 to crosslink. The masked region 50, in which the polymer fails to crosslink, can be dissolved (e.g., film development) and the nanowires removed. The film development thus reveals a pattern of a conductive region 40 corresponding to the opening 30 in the mask.

Thus, one embodiment provides a method that comprises: forming a thin film of interconnecting conductive nanostructures on a substrate by depositing an ink composition on the substrate, wherein the ink composition comprises a plurality of conductive nanostructures, a crosslinkable polymer, a photoinitiator, and a polar solvent; and removing the polar solvent; and exposing a portion of the thin film to a UV light source to cause the crosslinkable polymer in the exposed portion of the thin film to crosslink.

In a further embodiment, described herein is a method that comprises: forming a thin film of interconnecting conductive nanostructures on a substrate by depositing an ink composition on the substrate, wherein the ink composition comprises a plurality of conductive nanostructures, a crosslinkable polymer, a photoinitiator, and a polar solvent; and removing the polar solvent; placing a mask above the thin film, wherein the mask includes an opening and defines the underlying thin film into a masked region and an unmasked region, the unmasked region corresponding to the opening; exposing the thin film to a UV light source through the opening of the mask to cause the crosslinkable polymer in the unmasked region to crosslink; and dissolving the masked region of the thin film to provide a conductive region in a pattern that corresponds to the opening of the mask.

In various embodiments, the nanostructures are silver nanowires, and the crosslinkable polymer is PVP or HPMC.

The UV exposure is typically about 3-5 seconds (e.g., Fusion UV Systems). Following the UV exposure, the thin film can be developed by washing with a polar solvent, which is typically the same polar solvent in the ink composition (e.g., water). Optionally, the polar solvent can be heated to expedite the thin film dissolution in the masked region.

The unmasked region, i.e., the conductive region, comprises interconnected silver nanowires and crosslinked polymer (e.g., crosslinked PVP). Optical and electrical properties can be assessed according to known methods in the art.

Thus, in yet further embodiments, patterned conductive films are provided. One embodiment provides a patterned conductive film comprising a first region and a second region, wherein the crosslinkable polymer in the first region is crosslinked, and the crosslinkable polymer in the second region is removed. In a further embodiment, the first region is more conductive than the second region.

2. Thermal Development

In other embodiments, the photosensitive thin film described herein can be directly photo-patterned by sequential exposures to photo-irradiation and heat. Typically, the thin film comprises a photosensitive compound that is photo-degradable and heat-activatable.

Figure 2:
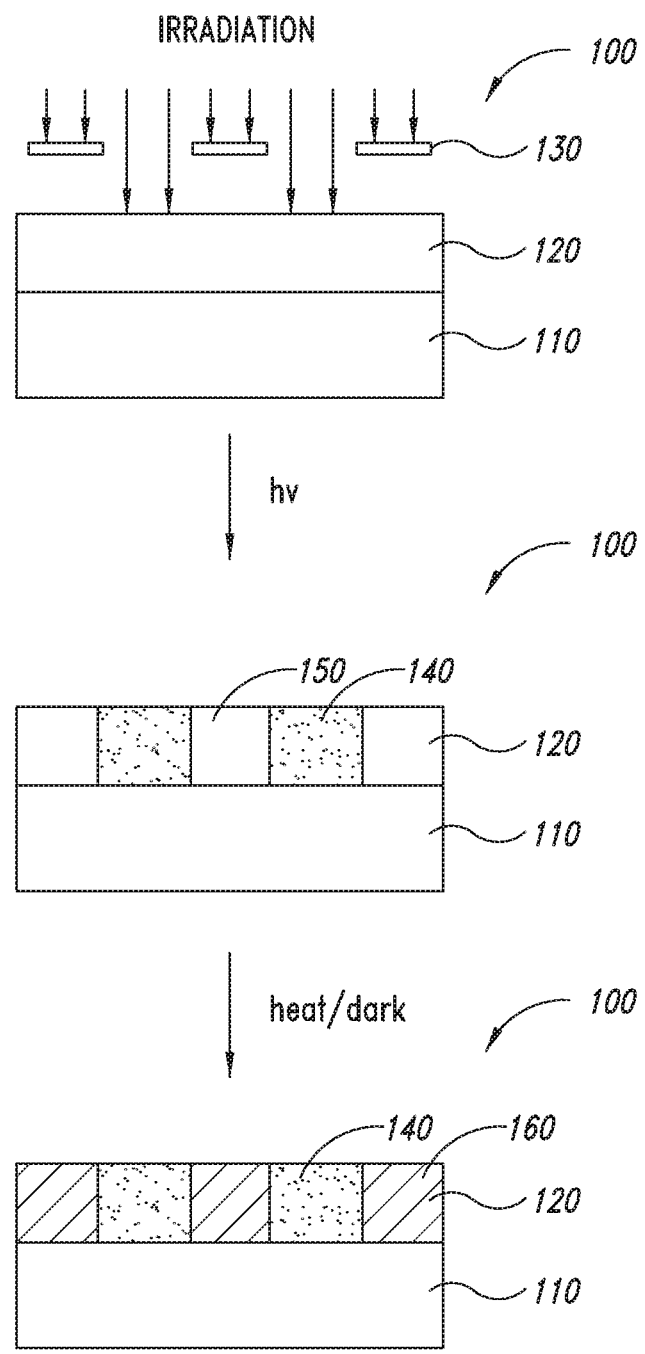
FIG. 2 shows an embodiment of the present disclosure in which an invisible or low-visibility pattern is formed in a transparent conductor having a heat-activatable photosensitive compound.

More specifically, as shown in FIG. 2, a transparent conductor 100 is first formed by spin-coating on a substrate 110 a thin film 120, which includes interconnecting metal nanostructures, a binder material and a heat-activatable photosensitive compound. A mask 130 is placed over the transparent conductor 100 and exposed to photo-irradiation at a first temperature. A latent image is formed and defined by an unmasked region 140 and a masked region 150. In the unmasked regions 140, the photosensitive compound is destroyed without affecting the structural integrity of the interconnecting metal nanostructures or the binder material. In the masked region 150, the photosensitive compound remains. Thereafter, the latent image of the photo-irradiation is thermally developed by thermally activating the photosensitive compound in the dark at a second temperature, whereby the photosensitive compound thermally degrades and one or more degradation products damage the nanostructures in the masked region 150, resulting in a less conductive region 160 as compared to the unmasked region 140.

The degree of damage with which the thermally degraded photosensitive compound causes the nanostructure may be associated with a number of factors, including the second temperature, the duration of the thermal activation at the second temperature, and the type of the photosensitive compound. Typically, the second temperature is higher than the first temperature.

Advantageously, because the nanostructures are not removed but merely rendered less conductive, the conductive region 140 and the less conductive region 160 are substantially uniform in their light transmissions and haze values. Such an invisible or low visibility pattern is desirable in many applications of the transparent conductor, including touch screens and flat panel displays.

Thus, one embodiment provides a method that comprises: forming a thin film of interconnecting conductive nanostructures on a substrate by depositing an ink composition on the substrate, wherein the ink composition comprises a plurality of conductive nanostructures, a binder material, a heat-activatable photosensitive compound, and a polar solvent; and removing the polar solvent; placing a mask above the thin film, wherein the mask includes an opening and defines the thin film into a masked region and an unmasked region, the unmasked region corresponding to the opening; exposing the thin film to a UV light source through the opening of the mask at a first temperature to cause photo-degradation of the photosensitive compound in the unmasked region; and exposing the thin film to a heat source in the dark at a second temperature to cause thermal-degradation of the photosensitive compound in the masked region.

In further embodiments, the nanostructures in the unmasked region are no less conductive after the UV irradiation, indicating that the photosensitive compound is destroyed without damaging the nanostructures. In other embodiments, following the thermal activation, the nanostructures in the masked region are damaged by the thermal degradation products of the photosensitive compound, as a result of which the thin film in the masked region is less conductive that the unmasked region.

In a further embodiment, the masked region and the unmasked region have substantially the same optical appearance such that the patterns are invisible or of low visibility. In various embodiments, the difference in the light transmissions in the respective regions is no more than 10%, or 8%, or 5%, or 3%. Similarly, the difference in the haze values in the respective regions is no more than 10%, or 8%, or 5%, or 3%.

Thus, in yet further embodiments, patterned conductive films are provided. One embodiment provides a patterned conductive film comprising a first region and a second region, wherein the heat-activatable photosensitive compound in the first region has photo-degraded, and the heat-activatable photosensitive compound in the second region has thermal-degraded. In a further embodiment, the first region is more conductive than the second region.

The various embodiments described herein are further illustrated by the following non-limiting examples.

EXAMPLES

Example 1

Standard Synthesis of Silver Nanowires

Silver nanowires were synthesized by a reduction of silver nitrate dissolved in ethylene glycol in the presence of poly(vinyl pyrrolidone) (PVP). The method was described in, e.g., Y. Sun, B. Gates, B. Mayers, & Y. Xia, "Crystalline silver nanowires by soft solution processing", *Nanolett*, 2(2): 165-168, (2002). Uniform silver nanowires can be selectively isolated by centrifugation or other known methods.

Alternatively, substantially uniform silver nanowires can be synthesized directly by the addition of a suitable ionic additive (e.g., tetrabutylammonium chloride) to the above reaction mixture. The silver nanowires thus produced can be used directly without a separate step of size-selection. This synthesis is described in more detail in applicant's co-owned and co-pending U.S. patent application Ser. No. 11/766,552, which application is incorporated herein in its entirety.

The synthesis could be carried out under a nitrogen purging, in ambient light (standard), or in the dark to minimize photo-induced degradation of the resulting silver nanowires.

Example 2

Preparation of Thin Films—PVP

A photosensitive ink composition was prepared by combining, by weight percentage, 0.1% IRGACURE® 754, 1% PVP (MW=1,300,000), 0.5% silver nanowires, 85% PGME and 14% water. The ink composition was spin-coated on a 2×2 inch glass slide. The solvents were allowed to air dry.

Example 3

Preparation of Thin Films—HPMC

A photosensitive ink composition was prepared by combining 12 mg IRGACURE® 754, 5 g of PGME, and 5 g of a formulation that comprises 0.38-0.4% silver nanowires, 0.4% HPMC, 0.0025% TRITON™ X-100, and water.

The ink composition (5 ml) was spin-coated on a 6×6 inch glass slide at 500 rpm for 60 seconds. The solvents were allowed to air dry at 38° C. for 60 seconds.

Example 4

Direct Photo-Patterning—Solvent Development

The thin film of Example 3 was formed on a glass substrate. A mask was placed over the thin film. The mask defined the underlying thin film into a masked region and an unmasked region (which corresponds to the openings of the mask). The thin film was then exposed to a UV light source (Fusion UV Systems) for about 3-5 seconds to allow the crosslinkable polymer in the exposed region of the thin film to crosslink. No crosslinking occurs in the masked region of the thin film. Following exposure, the thin film was developed by washing with water, whereby the masked region of the thin film dissolved and the nanowires were removed. The thin film was then dried in nitrogen atmosphere and baked at 180° C. for 90 seconds.

In the patterned thin film, the nanowires were intact in the unmasked, conductive regions, which registered a sheet resistance of about 150Ω/☐ by a 4 point probe. The masked region was non-conductive as substantially all of the nanowires of the masked region of the thin film have been washed away during the film development.

Example 5

Thermal- and Photo-Degradation of Photosensitive Compounds

1. Standard Ink Formulation Without Photosensitive Compound

Figure 3A:
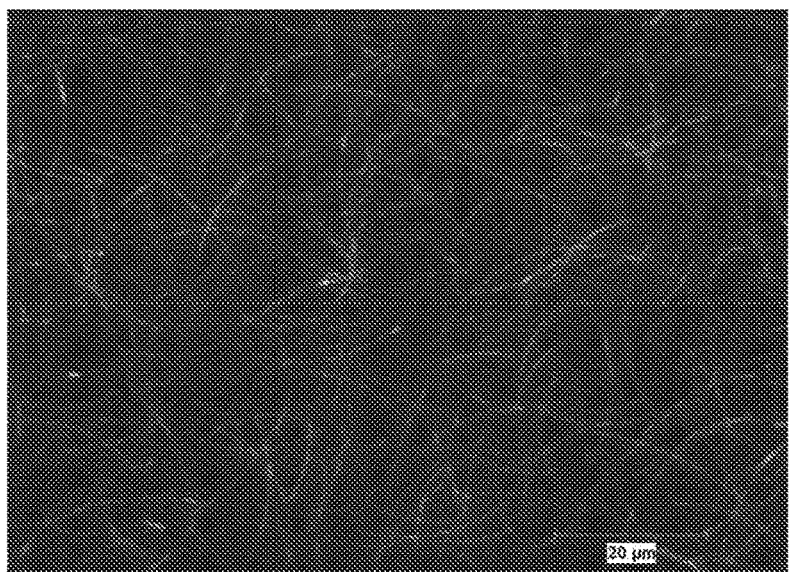
FIG. 3A shows a standard transparent conductor without any photosensitive compound.

A standard ink formulation of 0.4% HPMC in water containing 0.2% silver nanowires and 100 ppm TRITON™ X-100 was prepared. Transparent conducting thin films of silver nanowires in an HPMC binder were made by spin coating the ink formulation on a 2×2 glass substrate at 3000 rpm/60 sec. The film was then baked at 140° C. for 60 seconds. FIG. 3A shows a TEM image of the interconnecting silver nanowires in a thin film. This un-sensitized thin film was used as a control film (1).

2. Thermal Degradation of Thin Film With Heat-Activatable Photosensitive Compound A solution was made by dissolving 40 mg of diphenyliodonium nitrate (DPIN) in 0.5 g of water and 0.5 g of acetone. Thereafter, 0.5 g of the DPIN solution was added to 5 g of the standard ink formulation described above. The resulting ink containing the silver nanowires, HPMC, and DPIN was spun at 3000 rpm for 60 seconds in the dark to form a photosensitive thin film (2). The film was then baked at 140° C. for 90 seconds on a hot plate in the dark.

Figure 3B:
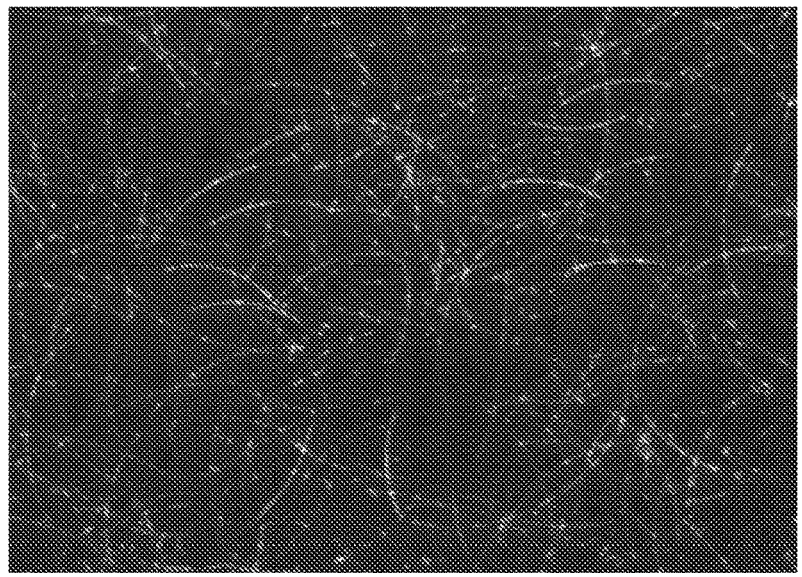
FIG. 3B shows broken or damaged nanowires in a transparent conductor including a heat-activatable photosensitive compound following a heat treatment in the dark.

FIG. 3B (magnification 100×, dark field) shows that the silver nanowires appeared broken at places. It could be speculated that the dark thermal degradation of DPIN is responsible for the structural damage to the silver nanowires, which resulted in a reduction of conductivity and a slight increase in haze (see, e.g., Table 1).

3. Photo-Degradation of Heat-Activatable Photosensitive Compound

Figure 3C:
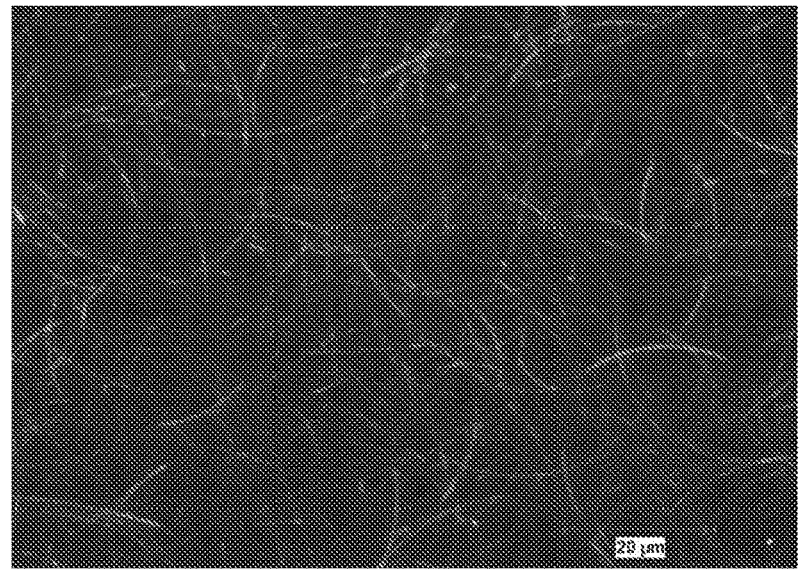
FIG. 3C shows intact nanowires in a transparent conductor including a photosensitive compound following photo-irradiation.

A solution was made by dissolving 40 mg of diphenyliodonium nitrate (DPIN) in 0.5 g of water and 0.5 g of acetone. Thereafter, 0.5 g of the DPIN solution was added to 5 g of the standard ink formulation described above. The resulting ink containing the silver nanowires, HPMC, and DPIN was spun at 3000 rpm for 60 seconds in the dark to form a photosensitive thin film (3). The film was then exposed to UV radiation on a Fusion curing system running at 10 ft/min, followed by baking at 140° C. for 90 seconds on a hot plate. The resulting film showed that that the silver nanowires appeared intact (FIG. 3C). Thus, it could be speculated that the DPIN had been entirely destroyed by UV irradiation without causing any structural damage to the silver nanowires, such that further baking at 140° C. did not produce any thermal-degradation products that could damage the silver nanowires.

Table 1 summarizes the optical and electrical properties of the thin firms (1), (2) and (3), which correspond to FIGS. 3A, 3B and 3C, respectively. As shown, as compared to the control film of FIG. 3A, the photosensitive film that underwent a thermal treatment (FIG. 3B) had a markedly increased resistance as a result of structural damage to the nanowires by one or more thermal degradation products. In contrast, the photosensitive film that underwent photo-irradiation prior to a thermal treatment (FIG. 3C) had a very minor increase in resistance as compared to the control film. The optical and electrical properties of these films are shown to be consistent with their structural characteristics.

TABLE 1

|  | Control Film (1) | Thin Film (2) | Thin Film (3) |
|---|---|---|---|
| T % | 92.5 | 92.0 | 92.3 |
| H % | 0.62 | 0.75 | 0.61 |
| R (Ohm/Sq) | 78 | >19,999 | 114 |

Example 6

A solution was made by dissolving 40 mg of diphenyliodonium nitrate (DPIN) in 0.5 g of water and 0.5 g of acetone. Thereafter, 0.5 g of the DPIN solution was added to 5 g of the standard ink formulation described in Example 5. The resulting ink containing the silver nanowires, HPMC, and DPIN was spun at 3000 rpm for 60 seconds in the dark to form a photosensitive thin film (4). The thin film was then baked at 100° C. for 90 seconds on a hot plate in the dark.

Table 2 shows the optical and electrical properties of thin film (4) as well as those of the control film (1) and the thin film (2).

TABLE 2

|  | Control Film (1) | Thin Film (2) 140° C./90 sec | Thin Film (4) 100° C./90 sec |
|---|---|---|---|
| T % | 92.5 | 92.0 | 91.7 |
| H % | 0.62 | 0.75 | 0.78 |
| R (Ohm/Sq) | 78 | >19,999 | 280 |

As shown, given the same photosensitive compound and the duration of the thermal treatment, the temperatures of the thermal treatment correlate to the degrees of the structural damage to the silver nanowires. The higher the temperature, the more damage is done to the nanowires. Thus, a certain threshold temperature may be needed for the thermal degradation of DPIN and damage of the silver nanowires to occur to a significant degree.

Example 7

A solution was made by dissolving 40 mg of diphenyliodonium triflate (DPITf) in 0.5 g of water and 0.5 g of acetone. Thereafter, 0.5 g of the DPITf solution was added to 5 g of the standard ink formulation described in Example 5. The resulting ink containing the silver nanowires, HPMC, and DPITf was spun at 3000 rpm for 60 seconds in the dark to form a photosensitive thin film (5).

In addition, a photosensitive thin film (6) was also prepared, which was then exposed 3 times to UV radiation on a Fusion curing system running at 10 ft/min, followed by baking at 160° C. for 90 seconds on a hot plate.

Table 3 shows the optical and electrical properties of thin films (5) and (6) as well as those of the control film (1) and thin film (2).

TABLE 3

|  | Control Film (1) | Thin Film (2) DPIN 140° C./90 s | Thin Film (5) DPITf 160° C./90 s | Thin Film (6) DPITf Photo/ 160° C./90 s |
|---|---|---|---|---|
| T % | 92.5 | 92.0 | 91.8 | 91.8 |
| H % | 0.62 | 0.75 | 0.80 | 0.64 |
| R (Ohm/Sq) | 78 | >19,999 | 1600 | 160 |

Thin films comprising DPITf show thermal- and photo-degradation behaviors similar to those of thin films comprising DPIN, namely, DPITf thermally degraded in the dark and caused damage to the nanowires, as reflected by the increase in resistance in thin film (5). However, it would appear that DPITf is less efficient than DPIN at creating insulating films upon thermal exposure even at a slightly higher temperature.

Further, like DPIN, DPITf underwent photo-degradation and were likely completely destroyed such that a subsequent thermal treatment failed to produce sufficient thermal degradation products to damage the nanowires.

Example 8

Low-Visibility Patterning By Thermal Development

A solution was made by dissolving 40 mg of diphenyliodonium nitrate DPIN in 0.5 g of water and 0.5 g of acetone. Thereafter, 0.5 g of the DPIN solution was added to 5 g of an ink formulation comprising 0.3% silver nanowires, 0.3% HPMC, and 100 ppm of TRITON™ X-100. The resulting mixture was spun at 1000 rpm for 60 seconds in the dark, and briefly dried at 40° C. for 30 seconds in the dark to produce a photosensitive thin film (7). A photomask was applied onto the thin film (7) and the assembly was exposed to UV radiation on a Fusion system at 3 ft/min. The photomask was removed and the film was then baked at 140° C. for 90 seconds on a hot plate in the dark. The resulting film showed a faint haziness difference (e.g., less than 10% difference) between the exposed and unexposed regions. The electrical conductivity of the exposed regions was about 40 Ohm/sq, whereas the unexposed regions were insulating, thus demonstrating a low-visibility pattern can be created using only heat as the development step.

Example 9

Evaluation of Optical and Electrical Properties of Transparent Conductors

The transparent conductive films prepared according to the methods described herein were evaluated to establish their optical and electrical properties.

The light transmission data were obtained according to the methodology in ASTM D1003. Haze was measured using a BYK Gardner Haze-gard Plus. The sheet resistance was measured using a Fluke 175 True RMS Multimeter or contact-less resistance meter, Delcom model 717B conductance monitor. A more typical device is a 4 point probe system for measuring resistance (e.g., by Keithley Instruments).

The haze and transmission of the bare substrate (e.g., 0.04% haze and 93.4% transmission for glass) were typically included in the measurements.

The interconnectivity of the nanowires and an areal coverage of the substrate can also be observed under an optical or scanning electron microscope.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A method, comprising:
   forming a thin film of interconnecting conductive nanostructures on a substrate, wherein the forming comprises:
      depositing an ink composition on the substrate, wherein the ink composition comprises a plurality of conductive nanostructures, a binding material, a photosensitive compound, and a polar solvent; and
      removing the polar solvent, wherein:
         the photosensitive compound is a photoinitiator present at about 0.005% to 0.01% by weight of the ink composition, and
         the photoinitiator comprises a mixture of oxy-phenyl-acetic acid 2-[2-oxo-2-phenyl-acetoxy-ethoxy]-ethyl ester and oxy-phenyl-acetic acid 2-[2-hydroxy-ethoxy]-ethyl ester; and
      exposing a first portion of the thin film to an ultra violet (UV) light source to cause the binding material in the first portion of the thin film to crosslink.

2. The method of claim 1, further comprising placing a mask above the thin film prior to exposing the first portion of the thin film to the UV light source, wherein the mask comprises an opening that overlies the first portion of the thin film.

3. The method of claim 1, further comprising dissolving a second portion of the thin film that is not exposed to the UV light source.

4. The method of claim 1, wherein the binding material is a crosslinkable polymer selected from the group consisting of polyvinylpyrrolidone, polyvinyl alcohol, polyacrylamides, polyacrylates, polyethylene oxides, polyethylene imine, anionic and cationic polyelectrolytes, poly (2-ethyl-2-oxazoline), hydroxypropylmethyl cellulose, hydroxypropylmethyl cellulose phthalate, hydroxypropyl cellulose, hydroxybutylmethyl cellulose, ethylhydroxyethyl cellulose, sodium carboxymethyl-hydroxyethyl cellulose, and carboxymethylethyl cellulose.

5. The method of claim 1, wherein a ratio of the binding material to the conductive nanostructures is about 5 to about 0.000625.

6. The method of claim 1, wherein a ratio of the binding material to the conductive nanostructures is about 1.

7. The method of claim 1, wherein the binding material is hydroxypropylmethyl cellulose.

8. The method of claim 1, wherein:
   the polar solvent is a protic solvent having a polarity index of at least 4, and
   the polar solvent is about 94.5% to 99.0% by weight of the ink composition.

9. The method of claim 8, wherein the polar solvent is water, monohydric alcohol or polyhydric alcohol.

10. The method of claim 8, wherein the polar solvent is polypropylene glycol monomethyl ether.

11. The method of claim 1, wherein:
   the plurality of conductive nanostructures are metal nanowires, and
   the metal nanowires are about 0.01% to 10% by weight of the ink composition.

12. The method of claim 11, wherein the metal nanowires are more than 10 μm in length and less than 100 nm in diameter.

13. The method of claim 1, wherein a ratio of the photoinitiator to the binding material is about 0.01 to 0.1.

14. The method of claim 1, wherein the photoinitiator is about 0.01% by weight of the ink composition.

15. The method of claim 1, wherein:
   the ink composition further comprises a surfactant, and
   the surfactant is about 0.0025% to 0.1% by weight of the ink composition.

16. The method of claim 1, further comprising:
   applying a second polar solvent after exposing the first portion of the thin film to the UV light source, wherein the second polar solvent dissolves a second portion of the thin film different than the first portion of the thin film; and
   drying the thin film after applying the second polar solvent.

17. The method of claim 16, wherein the polar solvent and the second polar solvent have a same material composition.

18. The method of claim 16, wherein drying the thin film comprises:
   drying the thin film in a nitrogen atmosphere for at a temperature of about 180° C.

19. The method of claim 1, wherein:
   the polar solvent comprises propylene glycol monomethyl ether,
   the binding material comprises hydroxypropylmethyl cellulose,
   the ink composition comprises a surfactant, and
   the surfactant comprises an octylphenol ethoxylate.

20. A method, comprising:
   forming a thin film of interconnecting conductive nanostructures on a substrate, wherein the forming comprises:
      depositing an ink composition on the substrate, wherein the ink composition comprises a plurality of conductive nanostructures, a binding material, a photosensitive compound, and a polar solvent; and
      removing the polar solvent, wherein:
         the photosensitive compound is a photoinitiator present at about 0.005% to 1% by weight of the ink composition, and
         the photoinitiator is an onium salt that is thermally degradable and is capable of causing structural damage to the conductive nanostructures when heated; and
      exposing a first portion of the thin film to an ultra violet (UV) light source to cause the binding material in the first portion of the thin film to crosslink.

21. The method of claim 20, wherein:
   the binding material is a crosslinkable polymer, and
   the polar solvent has a polarity index of at least 4.

22. The method of claim 21, wherein:
   the plurality of conductive nanostructures are metal nanowires, and
   the metal nanowires are about 0.01% to 10% by weight of the ink composition.

23. The method of claim 20, wherein:
   the plurality of conductive nanostructures are metal nanowires, and
   the metal nanowires are about 0.01% to 10% by weight of the ink composition.

\* \* \* \* \*